(12) United States Patent
Haug et al.

(10) Patent No.: US 11,549,822 B2
(45) Date of Patent: *Jan. 10, 2023

(54) DEVICE AND METHOD FOR MONITORING A SENSOR CLOCK SIGNAL

(71) Applicant: Robert Bosch GmbH, Stuttgart (DE)

(72) Inventors: Michael Haug, Stuttgart (DE); Guenter Weiss, Walheim (DE); Michel Walz, Eningen (DE); Daniela Bommer, Leonberg (DE); Frank Schou, Ditzingen (DE); Rainer Gschwind-Schilling, Rutesheim (DE); Darko Rozic, Reutlingen (DE); Mustafa Ajanovic, Sindelfingen (DE); Joerg Conradt, Kornwestheim (DE); Marlon Ramon Ewert, Untergruppenbach (DE); Kevin Haist, Ditzingen (DE)

(73) Assignee: Robert Bosch GmbH, Stuttgart (DE)

( * ) Notice: Subject to any disclaimer, the term of this patent is extended or adjusted under 35 U.S.C. 154(b) by 328 days.

This patent is subject to a terminal disclaimer.

(21) Appl. No.: 16/652,942

(22) PCT Filed: Sep. 19, 2018

(86) PCT No.: PCT/EP2018/075320
§ 371 (c)(1),
(2) Date: Apr. 1, 2020

(87) PCT Pub. No.: WO2019/068465
PCT Pub. Date: Apr. 11, 2019

(65) Prior Publication Data
US 2020/0264012 A1  Aug. 20, 2020

(30) Foreign Application Priority Data

Oct. 5, 2017 (DE) ..................... 10 2017 217 719.5

(51) Int. Cl.
*G01D 3/08* (2006.01)
*G01D 18/00* (2006.01)
(Continued)

(52) U.S. Cl.
CPC .............. *G01D 3/08* (2013.01); *G01D 18/00* (2013.01); *G06F 1/08* (2013.01); *G06F 1/12* (2013.01);
(Continued)

(58) Field of Classification Search
CPC .......... G01D 3/08; G01D 18/00; G01D 21/00; G06F 1/08; G06F 1/12; G06F 1/04;
(Continued)

(56) References Cited

U.S. PATENT DOCUMENTS 10,972,250 B2 *  4/2021  Walz .................... H03K 5/19
2012/0287341 A1 * 11/2012  Choi .................... H04N 5/262
348/E5.104

(Continued)

FOREIGN PATENT DOCUMENTS

CN    103312303 A   9/2013
DE    44 38 613 A1  5/1995
(Continued)

OTHER PUBLICATIONS

International Search Report corresponding to PCT Application No. PCT/EP2018/075320, dated Jan. 7, 2019 (German and English language document) (7 pages).
(Continued)

*Primary Examiner* — Dac V Ha
(74) *Attorney, Agent, or Firm* — Maginot, Moore & Beck LLP

(57) ABSTRACT

A method monitors a sensor clock signal in a sensor unit, which is generated and output for a data transfer between the sensor unit and a control unit with a predefined period
(Continued)

duration. A reference clock signal having a predefined reference period duration is received. The sensor clock signal is compared to the reference clock signal. Based on the comparison, a deviation of the current period duration of the sensor clock signal from a target period duration is detected. Based on the detected deviation, a counting pulse or a reset pulse is emitted.

18 Claims, 4 Drawing Sheets

(51) Int. Cl.
  *G06F 1/08* (2006.01)
  *G06F 1/12* (2006.01)
  *H03K 5/19* (2006.01)
  *H03K 5/26* (2006.01)
  *H04L 7/00* (2006.01)
  *H04L 7/08* (2006.01)

(52) U.S. Cl.
  CPC ............... *H03K 5/19* (2013.01); *H03K 5/26* (2013.01); *H04L 7/0012* (2013.01); *H04L 7/08* (2013.01)

(58) Field of Classification Search
  CPC .......... H03K 5/19; H03K 5/26; H04L 7/0012; H04L 7/08
  See application file for complete search history.

(56) References Cited

U.S. PATENT DOCUMENTS

| | | | |
|---|---|---|---|
| 2018/0081389 A1* | 3/2018 | Wu | H04N 5/3765 |
| 2020/0403770 A1* | 12/2020 | Coat | H04L 7/08 |
| 2021/0325455 A1* | 10/2021 | Fayneh | H03K 19/00323 |

FOREIGN PATENT DOCUMENTS

| | | |
|---|---|---|
| DE | 10 2012 203 664 A1 | 9/2013 |
| EP | 1 768 317 A2 | 3/2007 |
| EP | 2 241 952 A1 | 10/2010 |
| JP | 2014-216786 A | 11/2014 |
| JP | 2019-45343 A | 3/2019 |
| WO | 2009/031060 A2 | 3/2009 |
| WO | 2013/083560 A1 | 6/2013 |
| WO | 2015/146112 A1 | 10/2015 |

OTHER PUBLICATIONS

Bosch et al., Peripheral Sensor Interface for Automotive Applications, Technical Specification, V2.1, Oct. 8, 2012 (62 pages).

* cited by examiner

DEVICE AND METHOD FOR MONITORING A SENSOR CLOCK SIGNAL

This application is a 35 U.S.C. § 371 National Stage Application of PCT/EP2018/075320, filed on Sep. 19, 2018, which claims the benefit of priority to Serial No. DE 10 2017 217 719.5, filed on Oct. 5, 2017 in Germany, the disclosures of which are incorporated herein by reference in their entirety.

The disclosure is based on a method for monitoring a sensor clock signal in a sensor unit according to the type of independent claim 1. The subject matter of the disclosure is also a device for carrying out such a method.

BACKGROUND

Peripheral Sensor Interface 5 (PSI5) is an open standard. Based on the previous PASO protocol, the PSI5 standard supports applications in which up to four sensors per bus node in different configurations can be queried by a control unit. A bidirectional communication is provided for sensor configuration and diagnostics.

In airbag systems, for example, data are evaluated from pressure sensors or accelerometers that communicate with the control unit via current-modulated two-wire buses using a Manchester encoded protocol. The PSI5 standard also specifies possible operating modes. These initially differ in synchronous and asynchronous operating modes. Depending on the connection of the sensors to the control unit, the synchronous operating modes result in three operating types: Parallel BUS Mode, in which the sensors are connected in parallel, Universal BUS Mode, in which the sensors are connected serially, and Daisy Chain BUS Mode. Combined with other parameters, such as the total number of time slots, data rate, data word length, parity/CRC monitoring, the PSI5 standard allows different realization possibilities. The use of a 10-bit data word length is widespread.

Modern-day pressure, acceleration and/or rotation rate sensors typically include an application-specific integrated circuit (ASIC) or a microcontroller, as well as a sensor element. These components are housed in a modular housing. The modules, in turn, are soldered or cold-contacted on a printed circuit board or on a holder. There is a plastic housing with a plug around the printed circuit board or module. The sensor unit is connected to the control unit via the plug and by means of a harness. In practice, a sensor clock oscillator of a sensor unit may drift off or break. As a result, the signals of the sensor units on the PSI5 bus can be distorted.

SUMMARY

The method for monitoring a sensor clock signal in a sensor unit with the features of independent claim 1 and the device for monitoring a sensor clock signal in a sensor unit with the features of independent claim 7 have the advantage that an error of the sensor oscillator can already be detected in the sensor unit before the signals on the PSI5 bus are faulty and a corresponding error message is sent from the sensor unit. Embodiments of the present invention disclosure detect a faulty or drifting sensor clock signal and advantageously send a corresponding error message to the control unit within a given period of time. Since oscillator errors can be detected quickly and reliably and can also be clearly assigned, the diagnostic coverage of the corresponding airbag system can be increased. As a result, road safety can advantageously be increased, as sensor units with a defective sensor oscillator result in faster alerts and can therefore be replaced more quickly, so that false failures to trigger in the airbag system can be reduced in an advantageous way.

Embodiments of the present invention disclosure provide a method for monitoring a sensor clock signal in a sensor unit that is generated and output for a data transfer between the sensor unit and a control unit with a predetermined period duration, wherein a reference clock signal with a predetermined reference period duration is received. Here, the sensor clock signal is compared with the reference clock signal, wherein a deviation of the current period duration of the sensor clock signal from a target period duration is determined based on the comparison, and wherein a counting pulse or a reset pulse is output based on the determined deviation.

In addition, a device for monitoring a sensor clock signal in a sensor unit is proposed, which a sensor oscillator generates and outputs to a control unit with a predetermined period for data transfer between the sensor unit and a control unit. A reference oscillator generates and outputs a reference clock signal with a predetermined reference period duration. Here, the device for monitoring a sensor clock signal in a sensor unit comprises an oscillator monitor, which receives the sensor clock signal and the reference clock signal and carries out the method for monitoring a sensor clock signal in a sensor unit.

The disclosure consists of a comparison of the sensor clock signal with a reference clock signal, which, for example, is transferred from the control unit to the sensor unit according to the PSI5 protocol and is received by the sensor unit. If the deviation of the sensor clock signal exceeds a predetermined percentage, the sensor unit sends a corresponding error signal to the control unit.

The device for monitoring a sensor clock signal in a sensor unit can be understood in the present case as an evaluation and control unit arranged in the sensor unit, which processes or evaluates detected sensor signals. The evaluation and control unit may have at least one interface, which can be implemented in hardware and/or software. In the case of a hardware embodiment, the interfaces can be, for example, part of a so-called system ASIC, which comprises various functions of the evaluation and control unit, such as the function of the oscillator monitor. However, it is also possible that the oscillator monitor and/or the interfaces are separate integrated circuits or at least partly consist of discrete components. In the case of a software embodiment, the interfaces can be software modules, which are present, for example, on a microcontroller alongside other software modules. Also advantageous is a computer program product with program code, which is stored on a machine-readable medium such as a semiconductor memory, a hard disk memory or an optical memory and which is used to perform the evaluation when the program is executed by the evaluation and control unit.

In the present case, a sensor unit is understood to be a unit that comprises at least one sensor element that directly or indirectly detects a physical variable or a change in a physical variable and preferably converts it into an electrical sensor signal. For example, the sensor unit can be designed as an accelerometer or as a pressure sensor or as a rotation rate sensor with corresponding sensor elements. The sensor unit can be installed, for example, in a vehicle bumper for the detection of pedestrian accidents. For the detection of side crashes, in an implementation as an accelerometer the sensor unit can be installed on the B, C or D columns of the vehicle or in an embodiment as a pressure sensor in the vehicle door. For the detection of front crashes, the sensor unit can be installed as an accelerometer in a central control unit or along a flexible cross member of the vehicle. For the detection of rollovers or skids, the sensor unit can be installed as a rotation rate sensor in the central control unit or in a separate housing on a vehicle center tunnel. The signals output by sensor units are further processed by algorithms within the control unit. If such an algorithm detects that a pedestrian collision, a side crash, a frontal crash or a rollover has occurred, a triggering decision is made for active restraints (e.g. airbags) in the vehicle depending on the detected accident scenario and this restraint is activated to protect the pedestrian in the event of a pedestrian collision or to protect the occupants of the vehicle in the event of a crash.

Due to the measures and further developments listed in the dependent claims, advantageous improvements to the method predetermined in independent claim 1 for monitoring a sensor clock signal in a sensor unit and the device predetermined in independent claim 7 for monitoring a sensor clock signal in a sensor unit are made possible.

It is particularly advantageous that the counting pulse can increment an error counter and the reset pulse can decrement or reset the error counter. The error counter can be incremented, for example, if the deviation of the sensor clock signal is within an acceptance window and outside a predetermined optimal value window. In addition, the error counter can be decremented or reset if the deviation of the sensor clock signal is within the acceptance window and within the predetermined optimal value window. In addition, an incrementing step and/or a decrementing step of the error counter can be predetermined. The limit value for the error counter can be predetermined, for example, depending on a period of the reference clock signal, the selected incrementing step and a defined time period in which a faulty sensor clock signal should be detected.

In an advantageous embodiment, the device according to the disclosure can comprise a counter that counts pulses of the sensor clock signal. Here, the oscillator monitor can start the counter at a start time at which the oscillator monitor receives a first synchronization pulse of the reference clock signal and can stop the counter at a stop time at which the oscillator monitor receives a subsequent second synchronization pulse. The use of the counter allows a particularly simple and cost-effective implementation of the device according to the disclosure for monitoring a sensor clock signal in a sensor unit. Thus, the oscillator monitor can read out a counter value of the counter and can compare it with a target counter value that is calculated from the ratio of the reference period duration to the target period duration of the sensor clock signal. For example, the target counter value can be calculated by the oscillator monitor or in advance and stored in a non-volatile memory in the sensor unit. Based on the comparison, the oscillator monitor can determine a deviation of the current period duration of the sensor clock signal from a target period duration.

In a further advantageous embodiment of the device according to the disclosure, the oscillator monitor can calculate the acceptance window, which can be limited downwards by a first counter value and upwards by a second counter value, based on a predetermined tolerance range for the deviation of the sensor clock signal. In addition, the oscillator monitor can calculate the optimal value window, which is limited downwards by a third counter value that is greater than the first counter value, and upwards by a fourth counter value, which is smaller than the second counter value, based on the predetermined tolerance range for the deviation of the sensor clock signal. In addition, the oscillator monitor can generate the counting pulse for the error counter if the deviation of the sensor clock signal is within the acceptance window and outside the optimal value window. Furthermore, the oscillator monitor can generate the reset pulse for the error counter if the deviation of the sensor clock signal is within the acceptance window and within the optimal value window.

In a further advantageous embodiment of the device according to the disclosure, the oscillator monitor can interpret the second synchronization pulse as a new first synchronization pulse and can restart the counter if the current counter value that is read out is within the acceptance window. In addition, the oscillator monitor may interpret the second synchronization pulse as an interference pulse if the corresponding current counter value that is read out is smaller than the first counter value. In this case, the oscillator monitor can ignore the second synchronization pulse interpreted as an interference pulse and does not change the error count or restart the error counter. Furthermore, the oscillator monitor may interpret the second synchronization pulse as the new first synchronization pulse if the corresponding current counter value that is read out is greater than the second counter value. In this case, the oscillator monitor may restart the counter in response to the second synchronization pulse interpreted as the new first synchronization pulse and does not change the error counter value. As a result, in embodiments of the present disclosure the data transfer becomes advantageously even more robust to EMC interference from outside, which can cause artificial or missing synchronization pulses. In addition, it can be advantageously prevented that EMC interference can lead to a change in the error counter value.

Exemplary embodiments of the disclosure are illustrated in the drawing and are explained in more detail in the following description. In the drawing, the same reference characters denote components or elements that perform the same or analogous functions.

DETAILED DESCRIPTION

Figure 1:
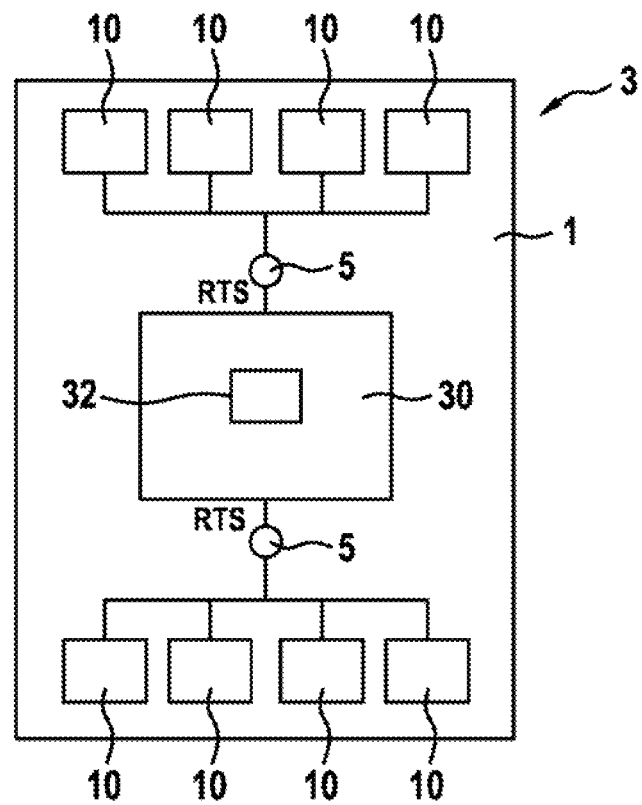
FIG. 1 shows a schematic block diagram of a sensor arrangement in a vehicle.
Figure 2:
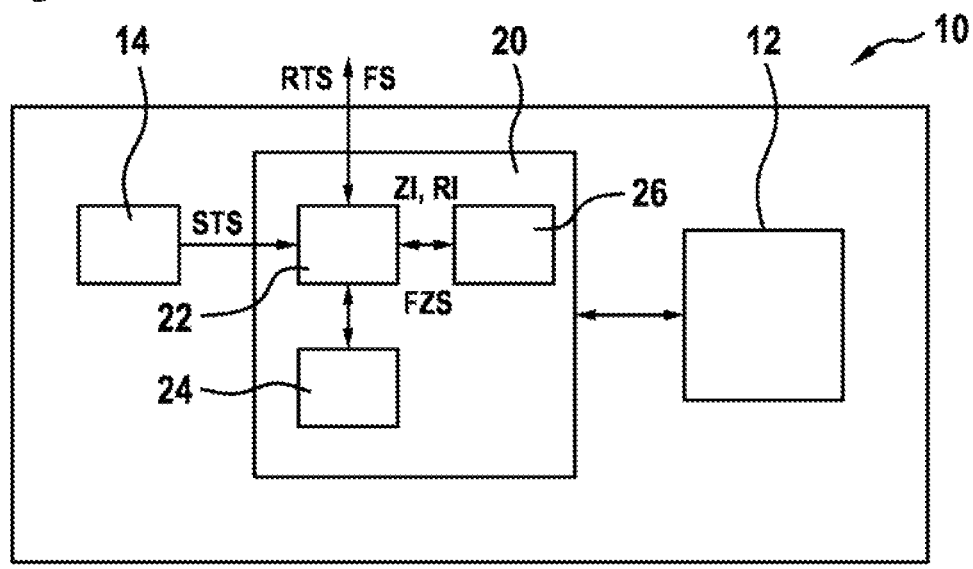
FIG. 2 shows a schematic block diagram of a sensor unit of the sensor arrangement from FIG. 1 with an embodiment of a device according to the disclosure for monitoring a sensor clock signal in a sensor unit.

As can be seen from FIGS. 1 and 2, a sensor arrangement 3 for a vehicle 1 in the illustrated exemplary embodiment comprises a control unit 30 with a reference oscillator 32, which generates and outputs a reference clock signal RTS with a predetermined reference period duration T_ref, multiple bus nodes 5, of which two bus nodes 5 are illustrated and multiple sensor units 10, each implemented as peripheral airbag sensors and connected to one of the bus nodes 5. In the exemplary embodiment illustrated, four sensor units 10 are connected to one of the bus nodes 5. In the illustrated sensor arrangement 3, which is part of a personal protection system of the vehicle 1, the individual sensor units 10, the bus nodes 5 and the control unit 30 are connected to each other via current-modulated two-wire buses and communicate by means of the PSI5 standard. This allows the control unit 30 to receive and evaluate the pressure or acceleration data or the rotation rate data collected by the sensor units 10.

As can further be seen from FIGS. 1 and 2, the individual sensor units 10 each comprise a sensor element 12, a sensor oscillator 14, which generates and outputs a sensor clock signal STS with a predetermined period T_STS, and a device 20 for monitoring a sensor clock signal STS in a sensor unit 10.

In the embodiment illustrated, the device 20 for monitoring a sensor clock signal STS in a sensor unit 10 is implemented as an application-specific integrated circuit (ASIC), which comprises at least one computer unit or at least one microcontroller and processes and evaluates detected sensor signals.

As can further be seen from FIG. 2, the device 20 for monitoring a sensor clock signal STS in a sensor unit 10 comprises an oscillator monitor 22, which receives the sensor clock signal STS and the reference clock signal RTS and carries out a method according to the disclosure for monitoring a sensor clock signal STS in a sensor unit 10. In this case, the sensor clock signal STS is compared in a first step with the reference clock signal RTS, wherein a deviation Delta_t of the current period duration T STS of the sensor clock signal STS from a target period duration T STS_soll is determined based on the comparison. Based on the determined deviation Delta_t, a counting pulse ZI or a reset pulse RI is then output.

The method for monitoring a sensor clock signal STS in a sensor unit 10 can be implemented in the individual sensor units 10 in software or hardware or in a mixture of software and hardware, for example.

In the exemplary embodiment illustrated, the reference clock signal RTS has a frequency of 2 kHz and a reference period duration T_ref of 500 μs ±1%. In the embodiment illustrated, the sensor clock signal STS has a frequency of 18 MHz and a setpoint period duration T_STS_soll of 0.0555 μs. For the detection of the deviation Delta_t of the sensor clock signal STS of the sensor unit 10 relative to the reference clock signal RTS of the control unit 30, the deviation Delta_t is thus calculated according to equation (1).

$$\text{Delta\_}t = T\_\text{ref} - N * T\_STS \text{ with } N = T\_\text{ref}/T\_STS\_\text{soll} \quad (1)$$

For the values given above, the factor N has a value of 9,000. Typical tolerances of the sensor clock signal STS over the service life are ±3.5%. According to the PSI5 standard, the upper limit allowed for deviations Delta_t of the sensor clock signal STS of the sensor unit 10 is ±5%. The tolerance of the reference clock signal is ±1%. An optimal value window WOpt illustrated in FIGS. 3 to 6, which specifies a permitted range for the deviation Delta_t of the sensor clock signal STS, can thus be predetermined with an additional safety margin.

An acceptance window AF illustrated in FIGS. 3 to 6 can be predetermined, for example, with an outer limit of ±10%. The outer limit of the exemplary acceptance window AF results from the tolerance of the sensor 14 of ±5%, the tolerance of the reference clock signal RTS of ±1% and the safety margin, which, for example, has a value of ±4%. For the detection of erroneous deviations Delta_t of the sensor clock signal STS, ranges are therefore in question that are outside the permitted deviation range or the optimal value window WOpt but within the acceptance window AF. Inner limits of these ranges for error detection can be at a deviation Delta_t of the sensor clock signal STS of between ±7% to 8%, for example. The outer limits of the AF acceptance window are typically at a deviation Delta_t of the sensor clock signal STS of approx. ±10%. With this numerical example, an erroneous deviation Delta_t of the sensor clock signal STS in the negative direction between −7% and −10% can be detected in a negative error window WNeg, while an erroneous deviation Delta_t of the sensor clock signal STS in the positive direction between +7% and 10% can be detected in a positive error window WPos. The 7% to 8% as the inner limit of the error detection consists of the permitted tolerance of the sensor oscillator 14 of ±5%, the tolerance of the reference clock signal RTS of ±1% and the safety margin, which as an example has a value of ±1 to 2%. If the detected sensor clock signal STS is in the negative error window WNeg or in the positive error window WPos, for example, the error signal FS is not output immediately, but instead the counting pulse ZI is output, which increments an error counter 26 in the exemplary embodiment illustrated. The error signal FS is only generated in the sensor unit 10 and transmitted to the control unit 30 if the error counter 26 exceeds a limit value GW illustrated in FIGS. 7 and 8. If the detected sensor clock signal STS is in the optimal value window WOpt, for example, then in the embodiment illustrated the reset pulse RI is generated and output, which can decrement or reset the error counter 26. This means that the error counter 26 is incremented if the deviation Delta_t is within the acceptance window AF and outside a predetermined optimal value window WOpt, and the error counter 26 is decremented or reset if the deviation Delta_t is within the acceptance window AF and within the predetermined optimal value window WOpt.

The error counter 26 is designed as a 16 bit variable counter in the embodiment illustrated. The error counter counts the number of cycles in which the deviation Delta_t is within the acceptance window AF and outside the predetermined optimal value window WOpt. The error counter 26 can be incremented with different steps in each relevant cycle. When decrementing, the error counter 26 can also use different steps. The limit value GW for the error counter 26 can be predetermined, for example, depending on a period T_ref of the reference clock signal RTS, the selected incrementing step and a defined time period in which a faulty sensor clock signal STS should be detected.

Figure 7:
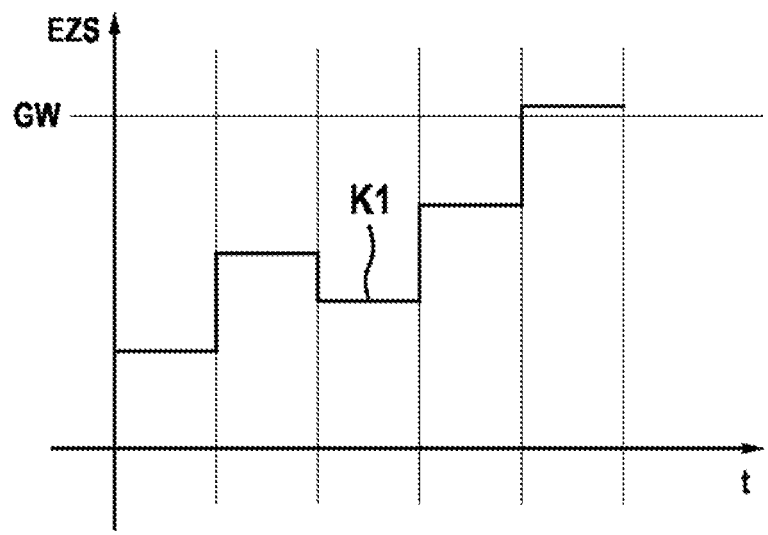
FIG. 7 shows a schematic illustration of a counting process of a first exemplary embodiment of an error counter 5 for the device according to the disclosure for monitoring a sensor clock signal in a sensor unit from FIG. 2.

As can also be seen from FIG. 7, in the exemplary embodiment illustrated an incrementing step and a decrementing step of the error counter 26 are predetermined, wherein the decrementing step is predetermined as smaller than the incrementing step. As can also be seen from FIG. 7, the error counter 26 is incremented twice in the characteristic curve K1 illustrated, then decremented once and then incremented again twice. The error signal FS is only output when an error counter value FZS reaches or exceeds the predetermined limit value GW.

Figure 8:
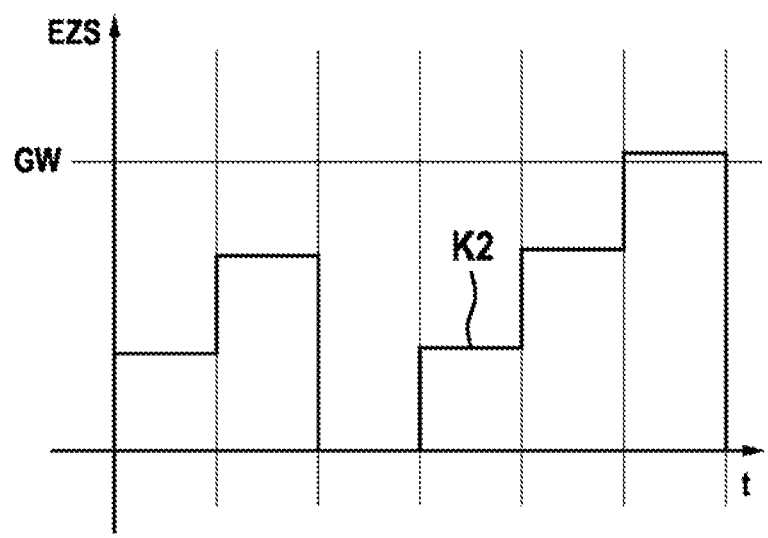
FIG. 8 shows a schematic illustration of a counting process of a second exemplary embodiment of an error counter for the device according to the disclosure for monitoring a sensor clock signal in a sensor unit from FIG. 2.

As can also be seen from FIG. 8, in the exemplary embodiment illustrated an incrementing step of the error counter 26 is predetermined, wherein in the embodiment illustrated the error counter 26 is not decremented but is reset if the deviation Delta_t is within the acceptance window AF and within the predetermined optimal value window WOpt. As can also be seen from FIG. 8, the error counter 26 is incremented twice in the characteristic curve K2 illustrated, then reset once and then incremented again three times. The error signal FS is only output when an error counter value FZS reaches or exceeds the predetermined limit value GW.

The error counter 26 can advantageously prevent one-off events, such as interference pulses or erroneous synchronization pulses, from causing the generation and output of an error signal.

In the embodiment illustrated, the device 20 for monitoring a sensor clock signal STS in a sensor unit 10 comprises a counter 24, which counts pulses of the sensor clock signal STS. The operation of the device 20 for monitoring a sensor clock signal STS in a sensor unit 10 from FIG. 2 is described below with reference to FIGS. 3 to 6. The oscillator monitor 22 starts the counter 24 at a start time t_start, t_start''', at which the oscillator monitor 22 receives a first synchronization pulse SP1 of the reference clock signal RTS. The oscillator monitor 22 stops the counter 24 at a stop time t_stop, t_stop', t_stop'', t_stop''', at which the oscillator monitor 22 receives a subsequent second synchronization pulse SP2, SP2', SP2'', SP2'''. The oscillator monitor 22 then reads out a counter value ZS of the counter 24 and compares it with a target counter value ZS_soll, which is calculated from the ratio of the reference period duration T_ref to the target period duration T_STS_soll of the sensor clock signal STS. The above values give a target counter value ZS_soll of 9,000. Thus, the oscillator monitor 22 can determine the deviation Delta_t of the current period duration T_STS of the sensor clock signal STS from the target period duration T_STS_soll based on a comparison of the target counter value ZS_soll and the current counter value ZS according to equation (2)

$$\text{Delta}\_t = (ZS\_\text{soll} - ZS) * T\_STS\_\text{soll} \quad (2)$$

Based on the predetermined tolerance range of ±10% for the deviation Delta_t, the oscillator monitor 22 calculates the acceptance window AF, which is limited downwards by a first counter value ZS_min of 8,100 in this case and upwards by a second counter value ZS_max of 9,900 in this case. In addition, the oscillator monitor calculates the optimal value window WOpt, which is limited downwards by a third counter value ZSW_min of 8,370 in this case and upwards by a fourth counter value ZSW_max of 9,630 in this case. Thus, the negative error window WNeg has the first counter value ZS_min of 8,100 as the lower limit and the third counter value ZSW_min of 8,370 as the upper limit. The positive error window WPos has the fourth counter value ZSW_max of 9,630 as the lower limit and the second counter value ZS_max of 9,900 as the upper limit.

Figure 3:
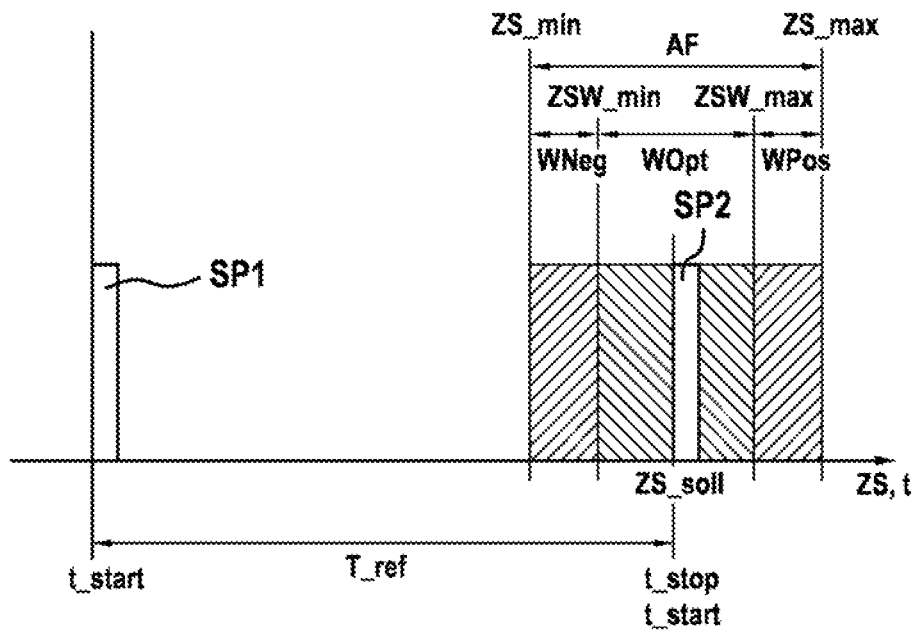
FIG. 3 shows a schematic illustration of a first timeline for a method according to the disclosure for monitoring a sensor clock signal in a sensor unit, wherein a second synchronization pulse is received within an acceptance window and within an optimal value window.

As can also be seen from FIG. 3, the oscillator monitor receives the first synchronization pulse SP1 at the start time t_start and starts the counter 24. At the stop time t_stop, the oscillator monitor 22 receives the second synchronization pulse SP2 within the acceptance window AF and within the optimal value window WOpt. This means that the current counter value ZS that is read out lies between the third counter value ZSW_min of 8,370 in this case and the fourth counter value ZSW_max of 9,630 in this case. Therefore, the oscillator monitor 22 interprets the two synchronization pulses SP1, SP2 as a valid synchronization pulse pair. As FIG. 3 shows an optimal condition with a deviation Delta_t of 0, the current counter value ZS that is read out corresponds to the target counter value ZS_soll. Since the deviation Delta_t is within the acceptance window AF and within the optimal value window WOpt, the oscillator monitor 22 generates the reset pulse RI for the error counter 26. Depending on the implementation of the error counter 26, the error count value FZS is decremented or reset. In addition, the oscillator monitor 22 interprets the second synchronization pulse SP2 as the new first synchronization pulse SP1 and restarts the counter 24.

Figure 4:
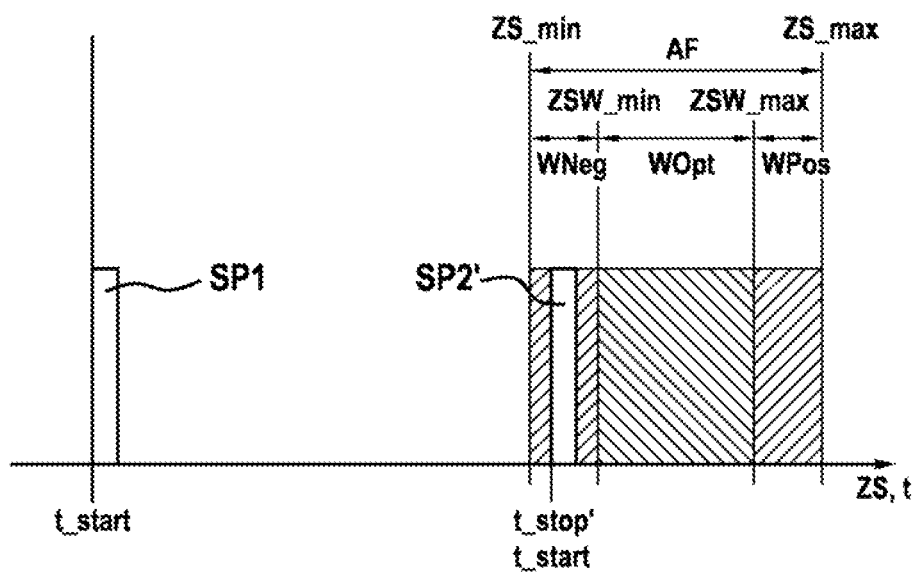
FIG. 4 shows a schematic illustration of a second timeline for a method according to the disclosure for monitoring a sensor clock signal in a sensor unit, wherein the second synchronization pulse is received within the acceptance window but outside the optimal value window.

As can also be seen from FIG. 4, the oscillator monitor receives the first synchronization pulse SP1 at the start time t_start and starts the counter 24. At the stop time t_stop, the oscillator monitor 22 receives the second synchronization pulse SP2' within the acceptance window AF but outside the optimal value window WOpt. In the illustration, the second synchronization pulse SP2' is within the negative error window WNeg. This means that the current counter value ZS that is read out is between the first counter value ZS_min of 8,100 in this case and the third counter value ZSW_min of 8,370 in this case. Therefore, the oscillator monitor 22 interprets the two synchronization pulses SP1, SP2 as a valid synchronization pulse pair. Since the deviation Delta_t is within the negative error window WNeg, i.e. within the acceptance window AF but outside the optimal value window WOpt, the oscillator monitor 22 generates the counting pulse ZI for the error counter 26. Therefore, the error counter 26 increments the error counter value FZS. The oscillator monitor 22 checks whether the current error counter value FZS has reached or exceeded the predetermined limit value GW. If this is the case, then the oscillator monitor 22 generates the error signal FS and outputs it to the control unit 30. Since the current counter value ZS that is read out is within the acceptance window AF, the oscillator monitor 22 interprets the second synchronization pulse SP2' as the new first synchronization pulse SP1 and restarts the counter 24.

Figure 5:
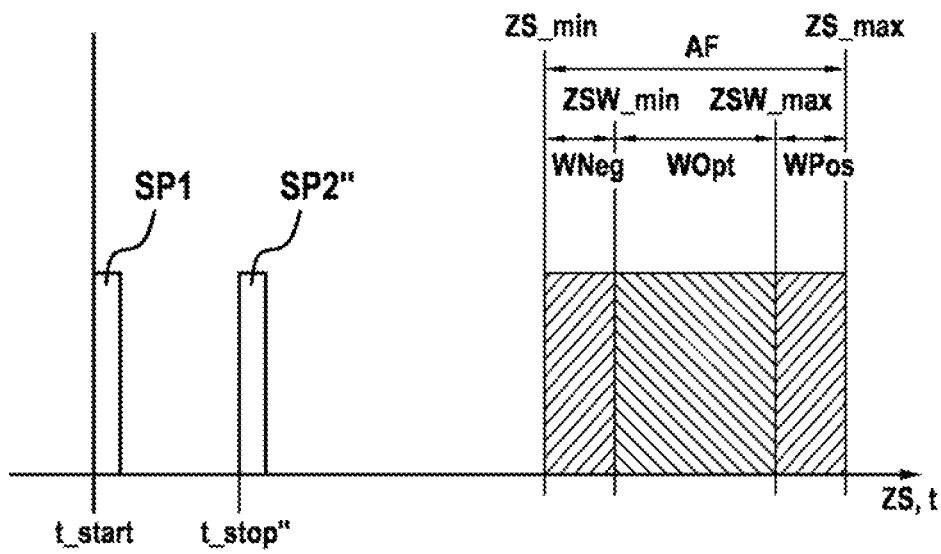
FIG. 5 shows a schematic illustration of a third timeline for the method according to the disclosure for monitoring a sensor clock signal in a sensor unit, wherein the second synchronization pulse is received before the acceptance window.

As can also be seen from FIG. 5, the oscillator monitor receives the first synchronization pulse SP1 at the start time t_start and starts the counter 24. At the stop time t_stop'', the oscillator monitor 22 receives the second synchronization pulse SP2'' outside the acceptance window AF. In the illustration according to FIG. 5 the counter value ZS that is read out is below the first counter value ZS_min of 8,100 in this case. Therefore, the oscillator monitor 22 interprets the second synchronization pulse SP2'' as an interference pulse and the two synchronization pulses SP1, SP2'' as an invalid synchronization pulse pair. Since this is an interference pulse, the oscillator monitor 22 ignores it and does not change the error counter value FZS or restart the counter 24.

Figure 6:
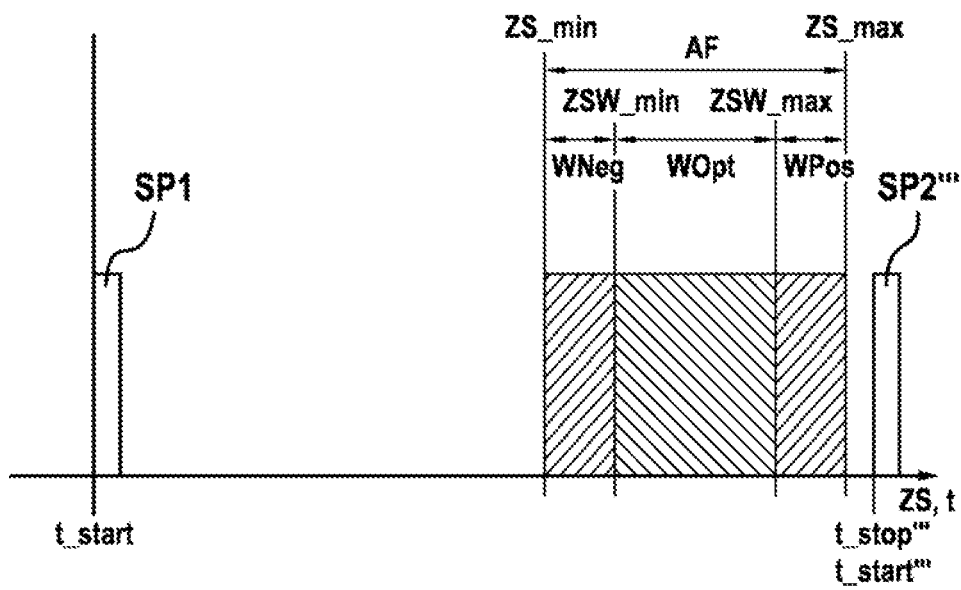
FIG. 6 shows a schematic illustration of a fourth timeline for the method according to the disclosure for monitoring a sensor clock signal in a sensor unit, wherein the second synchronization pulse is received after the acceptance window.

As can also be seen from FIG. 6, the oscillator monitor receives the first synchronization pulse SP1 at the start time t_start and starts the counter 24. At the stop time t_stop''' the oscillator monitor 22 receives the second synchronization pulse SP2''' outside the acceptance window AF. In the illustration according to FIG. 6, the counter value ZS that is read out is greater than the second counter value ZS_max of 9,900 in this case. In this case, the received second synchronization pulse SP2''' is accepted by the oscillator monitor 22. However, the oscillator monitor 22 interprets the second synchronization pulse SP2''' as the new first synchronization pulse SP1. This means that the second synchronization pulse SP2''' serves as a new start time t_start for the reference clock measurement or for the counter 24 in the sensor unit 10. However, there is no change in the error counter value FZS.

Embodiments of the disclosure offer the further advantage that the output of an error signal is even more robust against EMC interference from outside. Finally, in the event of EMC interference, no error signal should be output.

The invention claimed is:

1. A method for monitoring a sensor clock signal in a sensor unit, comprising:
   generating the sensor clock signal with a predetermined period duration;
   outputting the sensor clock signal for data transfer between the sensor unit and a control unit;
   receiving a reference clock signal with a predetermined reference period;
   comparing the sensor clock signal with the reference clock signal;
   determining a deviation of a current period duration of the sensor clock signal from a target period duration based on the comparison; and
   outputting a counting pulse or a reset pulse based on the determined deviation.

2. The method as claimed in claim 1, further comprising:
   incrementing an error counter based on the counting pulse; and
   decrementing or resetting the error counter based on the reset pulse.

3. The method as claimed in claim 2, further comprising:
   incrementing the error counter when the determined deviation is within an acceptance window and outside a predetermined optimal value window.

4. The method as claimed in claim 3, further comprising:
   decrementing or resetting the error counter when the determined deviation is within the acceptance window and within the predetermined optimal value window.

5. The method as claimed in claim 2, further comprising:
   predetermining the incrementing and/or the decrementing of the error counter.

6. The method as claimed in claim 1, further comprising:
   outputting an error signal when an error counter value reaches or exceeds a predetermined limit value.

7. A device for monitoring a sensor clock signal in a sensor unit the device comprising:
   a sensor oscillator configured to generate the sensor clock signal with a predetermined period duration for data transfer between the sensor unit and a control unit;
   a reference oscillator configured to generate and to output a reference clock signal with a predetermined reference period duration; and
   an oscillator monitor configured to receive the sensor clock signal and the reference clock signal and to monitor the sensor clock signal by (i) comparing the sensor clock signal with the reference clock signal, (ii) determining a deviation of a current period duration of the sensor clock signal from a target period duration based on the comparison, and (iii) outputting a counting pulse or a reset pulse to an error counter based on the determined deviation.

8. The device as claimed in claim 7, further comprising:
   a counter configured to count pulses of the sensor clock signal, wherein the oscillator monitor is configured (i) to start the counter at a start point, at which the oscillator monitor receives a first synchronization pulse of the reference clock signal, and (ii) to stop the counter at a stop time, at which the oscillator monitor receives a subsequent second synchronization pulse.

9. The device as claimed in claim 8, wherein:
   the oscillator monitor is configured to read out a counter value of the counter and to compare it with a target counter value, and
   the target counter value is calculated from a ratio of the predetermined reference period duration to the target period duration of the sensor clock signal.

10. The device as claimed in claim 8, wherein the oscillator monitor is configured to calculate an acceptance window, which is limited downwards by a first counter value (ZS_min) and is limited upwards by a second counter value (ZS_max), based on a predetermined tolerance range for the determined deviation.

11. The device as claimed in claim 10, wherein the oscillator monitor is configured to calculate an optimal value window, which is limited downwards by a third counter value, which is greater than the first counter value, and is limited upwards by a fourth counter value, which is smaller than the second counter value, based on the predetermined tolerance range for the determined deviation.

12. The device as claimed in claim 11, wherein the oscillator monitor is configured to generate the counting pulse for the error counter when the determined deviation is within the acceptance window and outside the optimal value window.

13. The device as claimed in claim 11, wherein the oscillator monitor is configured to generate the reset pulse for the error counter when the determined deviation is within the acceptance window and within the optimal value window.

14. The device as claimed in claim 10, wherein the oscillator monitor is configured to interpret the second synchronization pulse as a new first synchronization pulse and to restart the counter when the current counter value that is read out is within the acceptance window.

15. The device as claimed in claim 10, wherein the oscillator monitor is configured to interpret the second synchronization pulse as an interference pulse when the corresponding current counter value that is read out is less than the first counter value.

16. The device as claimed in claim 15, wherein the oscillator monitor is configured to ignore the second synchronization pulse interpreted as an interference pulse and to not make any change to the error counter.

17. The device as claimed in claim 10, wherein the oscillator monitor is configured to interpret the second synchronization pulse as a new first synchronization pulse when if the corresponding current counter value that is read out is greater than the second counter value.

18. The device as claimed in claim 17, wherein in response to the second synchronization pulse interpreted as the new first synchronization pulse the oscillator monitor is configured to restart the counter and not change the error counter.

* * * * *

UNITED STATES PATENT AND TRADEMARK OFFICE
CERTIFICATE OF CORRECTION

PATENT NO. : 11,549,822 B2
APPLICATION NO. : 16/652942
DATED : January 10, 2023
INVENTOR(S) : Haug et al.

Page 1 of 1

It is certified that error appears in the above-identified patent and that said Letters Patent is hereby corrected as shown below:

In the Claims

In Claim 10:
At Column 10, Line 22: the phrase "(ZS_min)" should be deleted; and
At Column 10, Line 23: the phrase "(ZS_max)" should be deleted.

Signed and Sealed this
Thirtieth Day of May, 2023

*Katherine Kelly Vidal*

Katherine Kelly Vidal
*Director of the United States Patent and Trademark Office*